United States Patent
Kim et al.

(10) Patent No.: US 12,501,781 B2
(45) Date of Patent: Dec. 16, 2025

(54) DISPLAY APPARATUS WITH PIXEL CIRCUITS CONNECTED TO LIGHT-EMITTING ELEMENTS AND METHOD OF MANUFACTURING THE SAME

(71) Applicant: Samsung Display Co., Ltd., Yongin-si (KR)

(72) Inventors: Yoolguk Kim, Yongin-si (KR); Jingoo Kang, Yongin-si (KR); Jiyoon Kim, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 747 days.

(21) Appl. No.: 17/860,032

(22) Filed: Jul. 7, 2022

(65) Prior Publication Data
US 2023/0081716 A1      Mar. 16, 2023

(30) Foreign Application Priority Data
Sep. 10, 2021   (KR) .................... 10-2021-0121167

(51) Int. Cl.
*H10K 59/122*   (2023.01)
*H10K 50/115*   (2023.01)
*H10K 59/12*    (2023.01)
*H10K 59/121*   (2023.01)
*H10K 59/80*    (2023.01)
*H10K 71/00*    (2023.01)

(52) U.S. Cl.
CPC ......... *H10K 59/122* (2023.02); *H10K 50/115* (2023.02); *H10K 59/1213* (2023.02); *H10K 59/80518* (2023.02); *H10K 59/80524* (2023.02); *H10K 59/873* (2023.02); *H10K 71/00* (2023.02); *H10K 59/1201* (2023.02)

(58) Field of Classification Search
CPC ............. H10K 59/122; H10K 59/1213; H10K 59/1201; H10K 71/00; H10K 50/115; H10K 50/818; H10K 50/828; H10K 50/844
USPC ............................................. 257/40, 59, 211
See application file for complete search history.

(56) References Cited

U.S. PATENT DOCUMENTS

| | | |
|---|---|---|
| 7,511,420 B2 | 3/2009 | Adachi et al. |
| 7,696,681 B2 | 4/2010 | Park |
| 7,893,438 B2 | 2/2011 | Kim et al. |

(Continued)

FOREIGN PATENT DOCUMENTS

| | | |
|---|---|---|
| KR | 10-0543009 | 1/2006 |
| KR | 10-0670543 | 1/2007 |

(Continued)

*Primary Examiner* — Eric W Jones
(74) *Attorney, Agent, or Firm* — HARNESS, DICKEY & PIERCE, P.L.C.

(57) ABSTRACT

Provided are a display apparatus and a method of manufacturing the same. The display apparatus includes a substrate, a plurality of light-emitting elements on the substrate, a passivation layer covering the light-emitting elements, and a plurality of pixel circuits on the passivation layer and connected to the light-emitting elements, respectively. The light-emitting elements each include a first electrode integrally provided with the light-emitting elements on the substrate, an emission layer in an opening of a pixel-defining layer on the first electrode, and a second electrode on the emission layer.

18 Claims, 15 Drawing Sheets

(56) References Cited

U.S. PATENT DOCUMENTS

| | | | |
|---|---|---|---|
| 2002/0060518 A1* | 5/2002 | Duineveld | H10K 59/122 313/506 |
| 2006/0238115 A1* | 10/2006 | Lee | H10K 10/466 313/504 |
| 2007/0057263 A1* | 3/2007 | Kahen | C09K 11/883 257/79 |
| 2010/0013372 A1* | 1/2010 | Oikawa | H10K 50/84 313/498 |
| 2010/0264816 A1* | 10/2010 | Cok | H10K 59/131 313/506 |
| 2011/0033964 A1* | 2/2011 | Oh | H10K 71/00 438/34 |
| 2011/0101346 A1* | 5/2011 | Tateishi | H10D 62/80 257/43 |
| 2014/0027726 A1 | 1/2014 | Choi et al. | |
| 2019/0058019 A1* | 2/2019 | Hu | H10K 71/164 |
| 2024/0078971 A1* | 3/2024 | Han | H10D 86/451 |

FOREIGN PATENT DOCUMENTS

| | | |
|---|---|---|
| KR | 10-1060074 | 8/2011 |
| KR | 10-2014-0016111 | 2/2014 |

\* cited by examiner

DISPLAY APPARATUS WITH PIXEL CIRCUITS CONNECTED TO LIGHT-EMITTING ELEMENTS AND METHOD OF MANUFACTURING THE SAME

CROSS REFERENCE TO RELATED APPLICATION

This application claims priority from and the benefit of Korean Patent Application No. 10-2021-0121167, filed on Sep. 10, 2021, which is hereby incorporated by reference for all purposes as if fully set forth herein.

BACKGROUND

Field

Embodiments of the invention relate generally to a display apparatus and a method of manufacturing the same.

Discussion of the Background

Recently, the usage of display apparatuses has diversified. Also, display apparatuses have become thinner and more lightweight, and thus, the use of display apparatuses has expanded. As display apparatuses are used in various fields, the demand for display apparatuses that provide high-quality images is increasing.

The above information disclosed in this Background section is only for understanding of the background of the inventive concepts, and, therefore, it may contain information that does not constitute prior art.

SUMMARY

One or more embodiments include a display apparatus in which the quality of light-emitting elements included therein is improved so that high-quality images are provided. However, this is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display apparatus includes a substrate, a plurality of light-emitting elements on the substrate, a passivation layer covering the plurality of light-emitting elements, and a plurality of pixel circuits on the passivation layer and connected to the plurality of light-emitting elements, respectively, wherein the plurality of light-emitting elements each include a first electrode integrally provided with the plurality of light-emitting elements on the substrate, an emission layer in an opening of a pixel-defining layer on the first electrode, and a second electrode on the emission layer.

In an embodiment, the first electrode may include a transparent or semitransparent electrode, and the second electrode may include a reflective electrode.

In an embodiment, the emission layer may include an inorganic material including s quantum dots.

In an embodiment, the passivation layer may include an inorganic material.

In an embodiment, the plurality of pixel circuits may include a thin-film transistor, and the thin-film transistor may include an oxide semiconductor.

In an embodiment, the display apparatus may further include a connection electrode on the passivation layer, wherein the thin-film transistor may be connected to the light-emitting elements through the connection electrode.

In an embodiment, the pixel-defining layer may include a first pixel-defining layer, and a second pixel-defining layer on the first pixel-defining layer, and a body portion of the second pixel-defining layer may have a reversed tapered structure.

In an embodiment, the second pixel-defining layer may include a liquid-repellent material.

In an embodiment, the display apparatus may further include a thin-film encapsulation layer on the plurality of pixel circuits, wherein the thin-film encapsulation layer may include at least one inorganic encapsulation layer and at least one organic encapsulation layer.

In an embodiment, the thin-film encapsulation layer may include a first inorganic encapsulation layer, a second inorganic encapsulation layer, and an organic encapsulation layer between the first inorganic encapsulation layer and the second inorganic encapsulation layer.

According to one or more embodiments, a method of manufacturing a display apparatus includes forming a first electrode on one surface of a substrate, forming a pixel-defining layer on the first electrode, the pixel-defining layer having a plurality of openings, forming an emission layer in each of the plurality of openings, forming a second electrode corresponding to the plurality of openings, forming a passivation layer on the second electrode, and forming a pixel circuit on the passivation layer, the pixel circuit including a thin-film transistor.

In an embodiment, the first electrode may be formed as a transparent or semitransparent electrode, and the second electrode may be formed as a reflective electrode.

In an embodiment, the emission layer may be formed by inkjet printing.

In an embodiment, the second electrode may be deposited by using a fine metal mask (FMM).

In an embodiment, the passivation layer may include an inorganic material and may be formed by a chemical vapor deposition process.

In an embodiment, the pixel circuit may include a thin-film transistor, and the thin-film transistor may include an oxide semiconductor.

In an embodiment, the method may further include forming a connection electrode on the passivation layer, wherein the thin-film transistor may be connected to the second electrode through the connection electrode.

In an embodiment, the pixel-defining layer may include a first pixel-defining layer, and a second pixel-defining layer on the first pixel-defining layer, and a body portion of the second pixel-defining layer may have a reversed tapered structure.

In an embodiment, the second pixel-defining layer may include a liquid-repellent material.

In an embodiment, an end of the second electrode may be disconnected by the second pixel-defining layer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
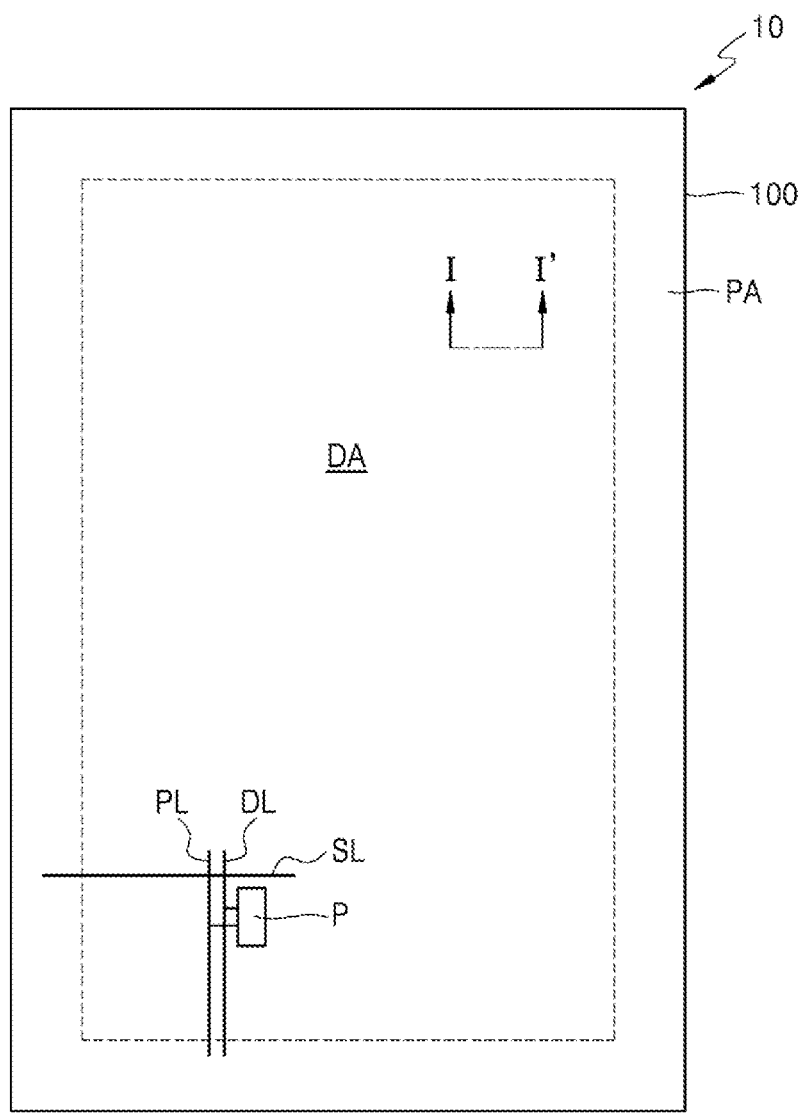
FIG. 1 is a schematic plan view illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings. When describing embodiments with reference to the accompanying drawings, the same or corresponding elements are denoted by the same reference numerals.

It will be understood that although the terms "first," "second" etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "include" and/or "comprise" used herein specify the presence of stated features or elements, but do not preclude the presence or addition of one or more other features or elements.

It will be further understood that, when a layer, region, or element is referred to as being "on" another layer, region, or element, it may be directly or indirectly on the other layer, region, or element. That is, for example, intervening layers, regions, or elements may be present.

Also, sizes of elements in the drawings may be exaggerated or reduced for convenience of explanation. For example, because sizes and thicknesses of elements in the drawings are arbitrarily illustrated for convenience of explanation, the disclosure is not limited thereto.

It will be further understood that, when layers, regions, or elements are referred to as being connected to each other, they may be directly connected to each other or indirectly connected to each other with intervening layers, regions, or elements therebetween. For example, when layers, regions, or elements are referred to as being electrically connected to each other, they may be directly electrically connected to each other or indirectly electrically connected to each other with intervening layers, regions, or elements therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

In this specification, the expression "A and/or B" indicates only A, only B, or both A and B.

Referring to FIG. 1, a substrate 100 of a display apparatus 10 may be divided into a display area DA and a peripheral area PA around the display area DA. The display apparatus 10 may provide a certain image by using light emitted from a plurality of pixels P in the display area DA.

Each of the pixels P may be implemented by a light-emitting element such as an organic light-emitting diode or an inorganic light-emitting diode, and may emit red light, green light, blue light, or white light. The light-emitting element that implements each of the pixels P may be connected to a pixel circuit including a thin-film transistor (TFT), a storage capacitor, and the like. The pixel circuit may be connected to a scan line SL, a data line DL crossing the scan line SL, and a driving voltage line PL. The scan line SL may extend in the x direction, and the data line DL and the driving voltage line PL may extend in the y direction.

The pixel circuit drives the pixel P to emit light, and the display area DA is configured to provide a certain image through the light emitted from the pixel P. The pixel P as used herein may be defined as an emission area configured to emit one of red light, green light, blue light, and white light, as described above.

The peripheral area PA is an area in which the pixels P are not arranged and through which an image is not provided. A terminal part, to which an internal driving circuit for driving the pixels P, a power supply line, and a printed circuit board or a driver integrated circuit (IC) including a driving circuit are connected, may be in the peripheral area PA.

The display apparatus 10 according to an embodiment may include an organic light-emitting display, an inorganic light-emitting display (inorganic electroluminescence (EL) display), a quantum dot display, and the like.

Figure 2:
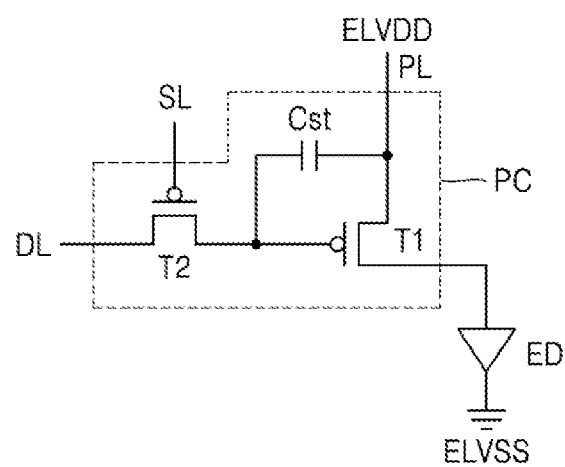
FIG. 2 illustrates a light-emitting element provided in a pixel of a display apparatus and a pixel circuit connected thereto, according to an embodiment.

FIG. 2 illustrates a light-emitting element ED provided in a pixel of a display apparatus and a pixel circuit PC connected thereto, according to an embodiment.

Referring to FIG. 2, the light-emitting element ED including a light-emitting diode is connected to the pixel circuit PC. The pixel circuit PC may include a first TFT T1, a second TFT T2, and a storage capacitor Cst. For example, the light-emitting element ED may emit red light, green light, or blue light, or may emit red light, green light, blue light, or white light.

The second TFT T2 acts as a switching TFT. The second TFT T2 may be connected to a scan line SL and a data line DL, and may be configured to transmit, to the first TFT T1, a data voltage input from the data line DL in response to a switching voltage input from the scan line SL. The storage capacitor Cst may be connected to the second TFT T2 and a driving voltage line PL, and may be configured to store a voltage corresponding to a difference between a voltage received from the second TFT T2 and a first power supply voltage ELVDD supplied to the driving voltage line PL.

The first TFT T1 acts as a driving TFT. The first TFT T1 may be connected to the driving voltage line PL and the storage capacitor Cst, and may be configured to control a driving current flowing from the driving voltage line PL to an organic light-emitting diode OLED according to a voltage value stored in the storage capacitor Cst. The organic light-emitting diode OLED may emit light having a certain luminance according to the driving current. An opposite electrode (e.g., a cathode) of the organic light-emitting diode OLED may be configured to receive a second power supply voltage ELVSS.

FIG. 2 illustrates that the pixel circuit PC includes two TFTs and one storage capacitor, but in another embodiment, the number of TFTs or the number of storage capacitors may be variously changed according to the design of the pixel circuit PC. Although FIG. 2 illustrates that the TFTs included in the pixel circuit PC are P-type metal oxide semiconductor (PMOS), at least one of the TFTs may be variously changed. For example, at least one of the TFTs may be provided as N-type metal oxide semiconductor (NMOS).

Figure 3:
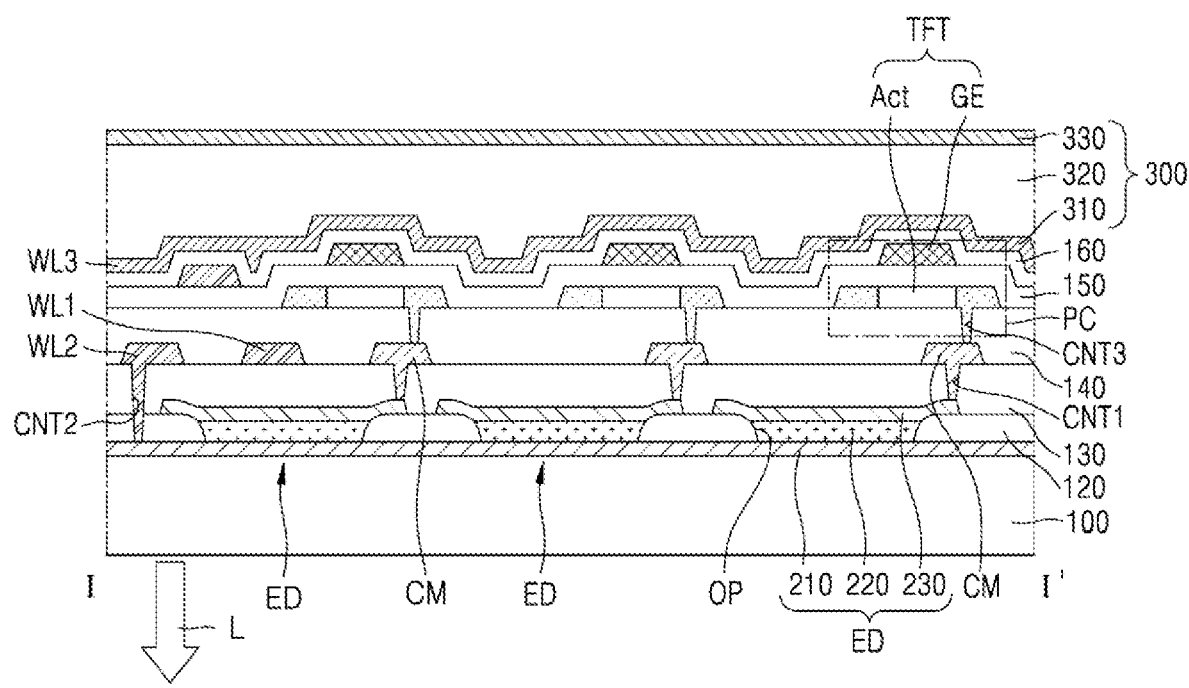
FIG. 3 is a schematic cross-sectional view of the display apparatus of FIG. 1 taken along line I-I' of FIG. 1, according to an embodiment.

FIG. 3 is a schematic cross-sectional view of the display apparatus 10 of FIG. 1 taken along line I-I' of FIG. 1, according to an embodiment.

Referring to FIG. 3, the display apparatus 10 according to an embodiment includes a substrate 100, a plurality of light-emitting elements ED on the substrate 100, a passivation layer 130 covering the light-emitting elements ED, and a plurality of pixel circuits PC on the passivation layer 130. That is, the light-emitting elements ED may be closer to the substrate 100 than the pixel circuits PC.

In the display apparatus 10 according to the present embodiment, the light-emitting element ED is on the upper surface of the substrate 100, and light L from the light-emitting element ED may be emitted to the lower surface of the substrate 100.

The substrate 100 may include a single glass layer. Alternatively, the substrate 100 may include a polymer resin. The substrate 100 including a polymer resin may have a structure in which a layer including a polymer resin and an inorganic layer are stacked. In an embodiment, the substrate 100 may include a polymer resin such as polyethersulfone, polyarylate, polyether imide, polyethylene naphthalate, polyethylene terephthalate, polyphenylene sulfide, polyimide, polycarbonate, cellulose triacetate, or/and cellulose acetate propionate, and may be flexible. The substrate 100 may include glass containing $SiO_2$ as a main component or a resin such as reinforced plastic, and may be rigid.

The light-emitting elements ED may be on the substrate 100. Each of the light-emitting elements ED may include a first electrode 210, an emission layer 220, and a second electrode 230.

The first electrode 210 may completely cover the display area of the substrate 100. The first electrode 210 may be integrally provided to correspond to the light-emitting elements ED. The first electrode 210 may be provided as a transparent electrode or a semitransparent electrode. For example, the first electrode 210 may include a transparent conductive material such as indium tin oxide (ITO), indium zinc oxide (IZO), zinc oxide (ZnO), or indium oxide ($In_2O_3$). Alternatively, the first electrode 210 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. The first electrode 210 may be a cathode electrode or an anode electrode.

A buffer layer (not illustrated) may be between the substrate 100 and the first electrode 210. The buffer layer may increase the smoothness of the upper surface of the substrate 100, or may prevent or minimize infiltration of impurities from the substrate 100 to the light-emitting element ED. The buffer layer may include an inorganic material such as silicon oxide, silicon nitride, and/or silicon oxynitride.

A pixel-defining layer 120 may be on the first electrode 210. The pixel-defining layer 120 has an opening OP exposing a central portion of the first electrode 210 of the light-emitting element ED. The emission layer 220 of the light-emitting element ED is in the opening OP of the pixel-defining layer 120, and the emission area of the light-emitting element ED may be defined by the opening OP of the pixel-defining layer 120.

The pixel-defining layer 120 may prevent an electric arc or the like from occurring on the edges of the second electrode 230 by increasing distances between the edges of the first electrode 210 and the second electrode 230.

The pixel-defining layer 120 may include an organic insulating material such as polyimide, polyamide, acrylic resin, benzocyclobutene, hexamethyldisiloxane (HMDSO), and phenol resin, and may be formed by spin coating. Alternatively, the pixel-defining layer 120 may include an inorganic insulating material. Alternatively, the pixel-defining layer 120 may have a multilayer structure including an inorganic insulating material and an organic insulating material. In some embodiments, the pixel-defining layer 120 may include a light blocking material, and may be provided in black. The light blocking layer may include carbon black, carbon nanotubes, a resin or paste including black dye, metal particles (e.g., nickel, aluminum, molybdenum, and any alloy thereof), metal oxide particles (e.g., chromium oxide), or metal nitride particles (e.g., chromium nitride). When the pixel-defining layer 120 includes a light blocking material, the reflection of external light due to the metal structures on the pixel-defining layer 120 may be reduced.

The emission layer 220 may be in the opening OP of the pixel-defining layer 120.

In some embodiments, the emission layer 220 may include an organic material including a fluorescent or phosphorescent material capable of emitting red light, green light, or red light. The above-described organic material may include a low molecular weight organic material or a high molecular weight organic material.

In some embodiments, the emission layer 220 may include an inorganic material including quantum dots. The quantum dots may include a nano-semiconductor compound including a Group II-VI semiconductor compound, a Group III-V semiconductor compound, a Group IV-VI semiconductor compound, or a Group semiconductor compound. More specifically, for example, the quantum dots may be selected from a Group II-VI semiconductor compound such as CdS, CdSe, CdTe, ZnS, ZnSe, ZnTe, HgS, or HgTe, a Group III-V semiconductor compound such as GaP, GaAs, GaSb, InP, InAs, InSb, CdSSe, CdSeTe, or ZnCdSe, a Group IV-VI semiconductor compound such as PbS, PbSe, or PbTe, and a Group I-III-VI semiconductor compound such as $AgGaS_2$, $AgGaSe_2$, $AgGaTe_2$, $AgInS_2$, $CuInS_2$, $CuInSe_2$, $CuGaS_2$, or $CuGaSe_2$.

The quantum dots may have a single-layer structure including the semiconductor compounds described above, or may have a core-shell structure. The core is a portion in which substantial light emission occurs, and the emission wavelength of the quantum dots is controlled according to the size and/or component of the core. The shell promotes the quantum confinement effect of the core and protects the quantum dots from heat, moisture, or oxygen. In addition, the shell may be a single layer, or may have a multilayer structure when necessary.

The core of the quantum dot may include, for example, a compound selected from ZnSe, ZnTe, CdSe, CdTe, InP, InGaP, ZnCdS, CuInS$_2$, CuInSe$_2$, and AgInS$_2$, and the shell may include, for example, a compound selected from ZnS, GaP, CdS, ZnSe, CdS/ZnS, ZnSe/ZnS, ZnS/ZnSe/CdSe, GaP/ZnS, CdS/CdZnS/ZnS, ZnS/CdS/ZnS, and CdZnS.

The quantum dots may be doped with a metal element such as Mn, Cu, Ag, or Al, and the emission wavelength of the quantum dots may be controlled through doping.

A common layer (not illustrated) may be above and/or below the emission layer 220. The common layer may include a hole transport layer (HTL), a hole injection layer (HIL), an electron transport layer (ETL), and/or an electron injection layer (EIL).

While the emission layer 220 is arranged for each light-emitting element to correspond to the opening OP of the pixel-defining layer 120, the common layer may be integrally provided to correspond to the light-emitting elements. The common layer may completely cover the display area of the substrate 100.

The second electrode 230 may include a reflective electrode. The second electrode 230 may include a reflective layer including Ag, Mg, Al, Pt, Pd, Au, Ni, Nd, Ir, Cr, and any compound thereof, and a transparent or semitransparent electrode layer on the reflective layer. The transparent or semitransparent electrode layer may include at least one selected from indium tin oxide (ITO), indium zinc oxide (IZO), zinc oxide (ZnO), indium oxide (In$_2$O$_3$), indium gallium oxide (IGO), and aluminum zinc oxide (AZO). In some embodiments, the second electrode 230 may have a three-layer structure including an ITO layer, an Ag layer, and an ITO layer. The second electrode 230 may be an anode electrode or a cathode electrode.

The second electrode 230 may be arranged to correspond to each light-emitting element ED. That is, the second electrodes 230 may be apart from each other on the substrate 100. A deposition process using a fine metal mask (FMM) may be performed to form the second electrodes 230.

The passivation layer 130 may be on the entire surface of the substrate 100 while covering the light-emitting elements ED. The passivation layer 130 may include an inorganic material such as silicon oxide, silicon nitride, and/or silicon oxynitride. The passivation layer 130 may have a single-layer or multilayer structure including the inorganic materials. The passivation layer 130 may function as a protective layer that prevents infiltration of foreign material or moisture into the light-emitting elements ED.

Various conductive layers such as a connection electrode CM, a first wiring WL1, and a second wiring WL2 may be on the passivation layer 130. The connection electrode CM, the first wiring WL1, and the second wiring WL2 may include at least one selected from molybdenum, aluminum, copper, and titanium, and may have a multilayer structure when necessary. The connection electrode CM, the first wiring WL1, and the second wiring WL2 may include at least one selected from copper, titanium, and aluminum, and may have a multilayer structure when necessary. For example, the connection electrode CM, the first wiring WL1, and the second wiring WL2 may have a three-layer structure including a titanium layer, an aluminum layer, and a titanium layer.

The connection electrode CM may be connected to the second electrode 230 of the light-emitting element ED through a first contact hole CNT1 passing through the passivation layer 130. Also, the connection electrode CM may be electrically connected to the pixel circuit PC on the connection electrode CM. For example, the connection electrode CM may be connected to a TFT included in the pixel circuit PC. In this case, the connection electrode CM may act as a source electrode or a drain electrode of the TFT. As such, the pixel circuit PC and the light-emitting element ED may be electrically connected to each other by the connection electrode CM.

The first wiring WL1 may be apart from the connection electrode CM, and may be used as various signal lines. In some embodiments, the first wiring WL1 may function as a data line configured to transmit a data signal. In some embodiments, the first wiring WL1 may function as a driving voltage line configured to transmit a driving voltage.

The second wiring WL2 may be connected to the first electrode 210 of the light-emitting element ED through a second contact hole CNT2 passing through the passivation layer 130 and the pixel-defining layer 120. The second wiring WL2 may function as a common voltage line configured to transmit a common voltage to the first electrode 210.

A first insulating layer 140 may be on the passivation layer 130 to cover the connection electrode CM, the first wiring WL1, and the second wiring WL2, and the pixel circuit PC may be on the first insulating layer 140. The pixel circuit PC may include at least one TFT. The first insulating layer 140 may include an inorganic insulating material such as silicon oxide (SiO$_2$), silicon nitride (SiN$_x$), silicon oxynitride (SiO$_x$N$_y$), aluminum oxide (Al$_2$O$_3$), titanium oxide (TiO$_2$), tantalum oxide (Ta$_2$O$_5$), or hafnium oxide (HfO$_2$). The first insulating layer 140 may be a single layer or multiple layers including the above-described inorganic insulating material.

The TFT may include a semiconductor layer Act and a gate electrode GE. The semiconductor layer Act may be on the first insulating layer 140 and may include an oxide semiconductor. For example, the semiconductor layer Act may include an oxide of at least one selected from indium (In), gallium (Ga), stannum (Sn), zirconium (Zr), vanadium (V), hafnium (Hf), cadmium (Cd), germanium (Ge), chromium (Cr), titanium (T1), and zinc (Zn). In another embodiment, the semiconductor layer Act may include polysilicon or amorphous silicon. The semiconductor layer Act may include a channel region, and a source region and a drain region having high conductivity on both sides of the channel region. The source region or the drain region of the semiconductor layer Act may be connected to the connection electrode CM through a third contact hole CNT3 passing through the first insulating layer 140.

A second insulating layer 150 may be arranged to cover the semiconductor layer Act. The second insulating layer 150 may include an inorganic insulating material such as silicon oxide (SiO$_2$), silicon nitride (SiN$_x$), silicon oxynitride (SiO$_x$N$_y$), aluminum oxide (Al$_2$O$_3$), titanium oxide (TiO$_2$), tantalum oxide (Ta$_2$O$_5$), or hafnium oxide (HfO$_2$). The second insulating layer 150 may be a single layer or multiple layers including the above-described inorganic insulating material.

The gate electrode GE may be on the second insulating layer 150 to overlap the semiconductor layer Act. The gate electrode GE may include molybdenum (Mo), aluminum (Al), copper (Cu), titanium (Ti), and the like, and may include a single layer or multiple layers. A third wiring WL3 may be on the second insulating layer 150. In some embodiments, the third wiring WL3 may be a scan line configured to transmit a scan signal.

A third insulating layer 160 may be arranged to cover the gate electrode GE. The third insulating layer 160 may include an inorganic insulating material such as silicon oxide ($SiO_2$), silicon nitride ($SiN_x$), silicon oxynitride ($Si-O_xN_y$), aluminum oxide ($Al_2O_3$), titanium oxide ($TiO_2$), tantalum oxide ($Ta_2O_5$), or hafnium oxide ($HfO_2$). The third insulating layer 160 may be a single layer or multiple layers including the above-described inorganic insulating material. Although FIG. 3 illustrates that the TFT is a top gate type transistor in which a gate electrode is above a semiconductor layer, the TFT may include various transistors such as a bottom gate type transistor.

A thin-film encapsulation layer 300 may be on the third insulating layer 160. The thin-film encapsulation layer 300 may include at least one inorganic encapsulation layer and at least one organic encapsulation layer. In an embodiment, the thin-film encapsulation layer 300 may include first and second inorganic encapsulation layers 310 and 330 and an organic encapsulation layer 320 therebetween.

The first inorganic encapsulation layer 310 and the second inorganic encapsulation layer 330 may include at least one inorganic insulating material selected from aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may have a single-layer or multi-layer structure including the above-described inorganic insulating material.

The organic encapsulation layer 320 may reduce internal stress of the first inorganic encapsulation layer 310 and/or the second inorganic encapsulation layer 330. The organic encapsulation layer 320 may include a polymer-based material. The polymer-based material may include polyethylene terephthalate, polyethylene naphthalate, polycarbonate, polyimide, polyethylene sulfonate, polyoxymethylene, polyarylate, hexamethyldisiloxane, acrylic resin (e.g., polymethylmethacrylate, polyacrylic acid, etc.), or any combination thereof.

The organic encapsulation layer 320 may be formed by applying a monomer having flowability and then curing a monomer layer by using heat or light such as ultraviolet light. Alternatively, the organic encapsulation layer 320 may be formed by applying the above-described polymer-based material.

The display apparatus according to the present embodiment may emit light toward the lower surface of the substrate 100, and the thin-film encapsulation layer 300 may include a metal. For example, the thin-film encapsulation layer 300 may include a metal such as Ag, Mg, Al, Pt, Pd, Au, Ni, Nd, Ir, or Cr. The metal included in the thin-film encapsulation layer 300 may be configured to reflect light so that the light is emitted toward the lower surface of the substrate 100. When the light-emitting element ED is farther from the substrate 100 than the pixel circuit PC, a thick organic planarization layer may be provided to flatten the upper surface of the insulating layer on which the light-emitting element ED is arranged. In this case, the lifespan of the light-emitting element ED may be reduced by outgas generated from the organic material.

In the display apparatus according to an embodiment, because the light-emitting element ED is closer to the substrate 100 than the pixel circuit PC, the surface on which the light-emitting element ED is flat. Therefore, an organic planarization layer may not be provided. Accordingly, outgassing due to the organic material may not occur. Also, in the display apparatus according to an embodiment, light emitted from the light-emitting element ED may travel to the lower surface of the substrate 100, and thus, an aperture ratio of the emission area may be sufficiently secured.

FIGS. 4A to 4F are schematic cross-sectional views sequentially illustrating a method of manufacturing a display apparatus, according to an embodiment.

Figure 4A:
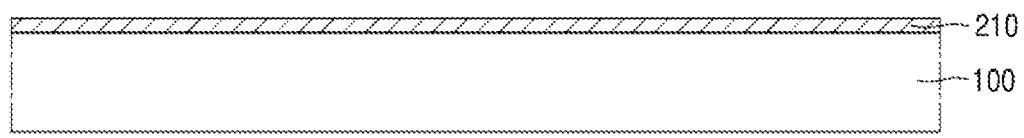
FIGS. 4A, 4B, 4C, 4D, 4E, and 4F are schematic cross-sectional views sequentially illustrating a method of manufacturing a display apparatus, according to an embodiment.

Referring to FIG. 4A, a first electrode 210 is formed on a substrate 100. The first electrode 210 may include a conductive layer of a transparent electrode or a semitransparent electrode. The first electrode 210 may be formed by various deposition processes such as a sputtering process, a vacuum deposition process, a chemical vapor deposition (CVD) process, a pulsed laser deposition process, a printing process, and an atomic layer deposition (ALD) process. The first electrode 210 may be formed to correspond to an entire area to be a display area of the substrate 100.

Figure 4B:
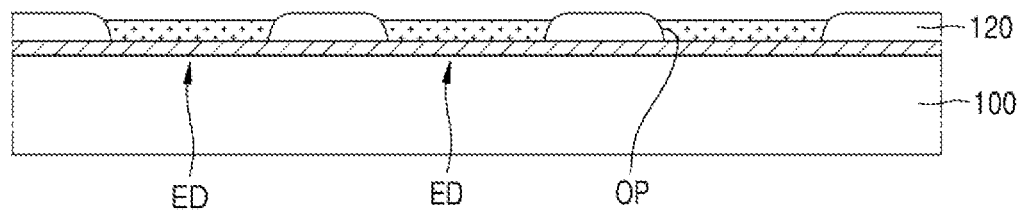

Referring to FIG. 4B, a pixel-defining layer 120 having an opening OP is formed on the first electrode 210. In order to form the pixel-defining layer 120, a preliminary pixel-defining layer (not illustrated) is formed on the first electrode 210. The preliminary pixel-defining layer may be formed by using an organic material, an inorganic material, or the like. The preliminary pixel-defining layer may be formed by a spin coating process, a printing process, a sputtering process, a CVD process, an ALD process, a plasma enhanced chemical vapor deposition (PECVD) process, a high density plasma chemical vapor deposition (HDP-CVD) process, or a vacuum deposition process, according to a constituent material thereof. An opening OP is formed in the preliminary pixel-defining layer to complete the pixel-defining layer 120. When the pixel-defining layer 120 includes a photosensitive organic material, the opening OP may be formed by an exposure process using a mask. As another embodiment, when the pixel-defining layer 120 includes an inorganic material, the opening OP may be formed by an etching process after a photoresist process.

An emission layer 220 is formed in the opening OP of the pixel-defining layer 120. The emission layer 220 may include an organic emission layer or a quantum dot emission layer. The emission layer 220 may be formed by inkjet printing, spin coating, thermal transfer using a laser, vacuum deposition, or the like. A plurality of emission layers 220 may be formed to be apart from each other to correspond to the respective openings OP of the pixel-defining layer 120. The emission layers 220 may include a red emission layer, a green emission layer, and a blue emission layer.

Figure 4C:
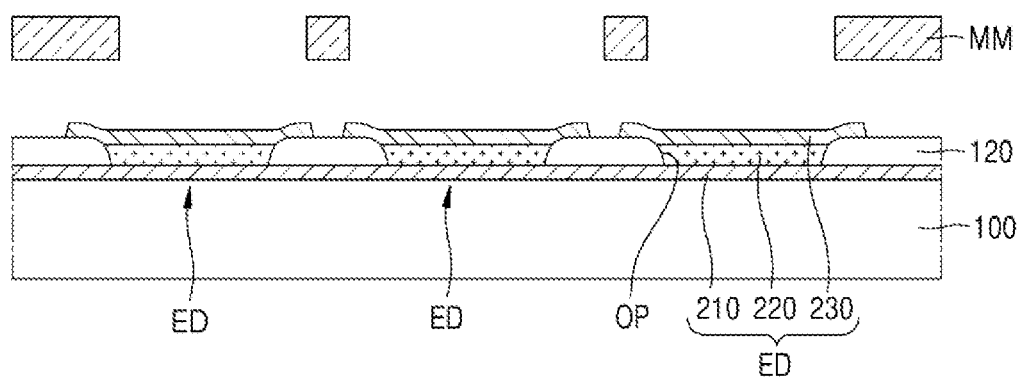

Referring to FIG. 4C, a plurality of second electrodes 230 may be formed to correspond to the emission layers 220, respectively. Because the emission layer 220 under the second electrode 230 may be damaged by heat and various etchants, the second electrode 230 may be formed by an emission layer forming process without a curing process or an etching process. In some embodiments, the second electrode 230 may be formed by a deposition process using an FMM MM. The deposition process may be a sputtering process, a vacuum deposition process, a CVD process, or the like. Because the FMM MM has an opening MM_OP corresponding to the opening OP of the pixel-defining layer 120, a conductive material forming the second electrode 230 may be deposited on the emission layer 220 through the opening MM_OP to form the second electrode 230. A plurality of second electrodes 230 may be provided. In this case, the second electrodes 230 may be apart from each other. As such, the first electrode 210, the emission layer 220, and the second electrode 230 may be stacked to form the light-emitting element ED.

Figure 4D:
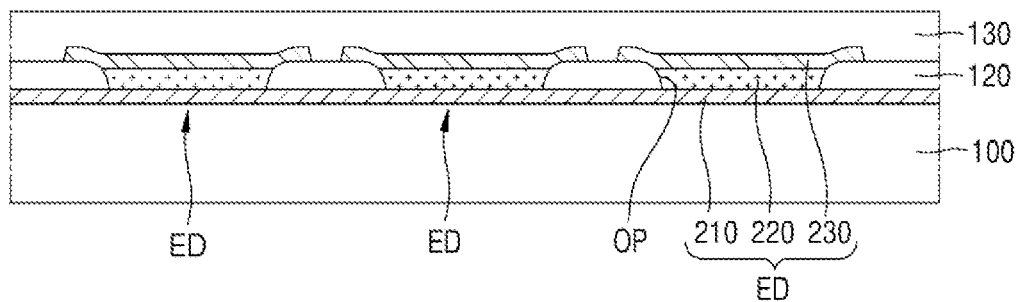

Referring to FIG. 4D, a passivation layer 130 covering the light-emitting elements ED is formed. The passivation layer 130 may include a single layer or multiple layers including an inorganic material such as silicon oxide, silicon nitride, and/or silicon oxynitride. The passivation layer 130 may be formed by a CVD process.

Figure 4E:
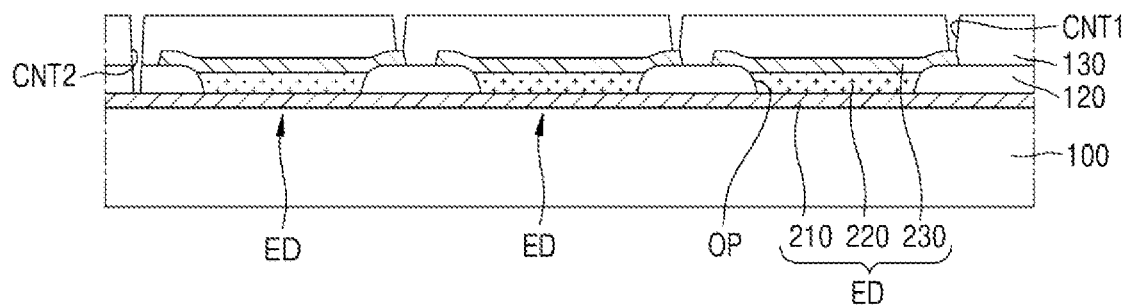

Referring to FIG. 4E, a first contact hole CNT1 exposing the second electrode 230 and a second contact hole CNT2 exposing the first electrode 210 are formed. In order to form the first contact hole CNT1 and the second contact hole CNT2, a photoresist pattern process and an etching process may be performed. In some embodiments, the etching process may be dry etching.

Figure 4F:
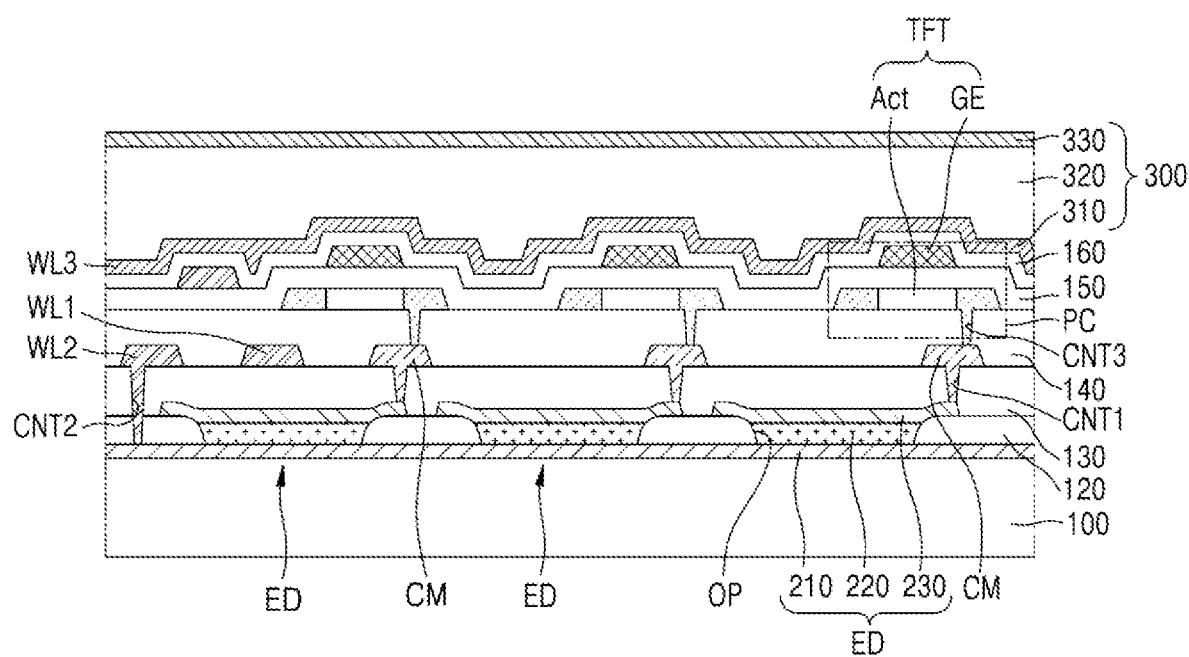

Referring to FIG. 4F, a connection electrode CM, a first wiring WL1, and a second wiring WL2 are formed on the passivation layer 130, and a pixel circuit PC and a thin-film encapsulation layer 300 are formed thereon, thereby completing a display apparatus.

Figure 5:
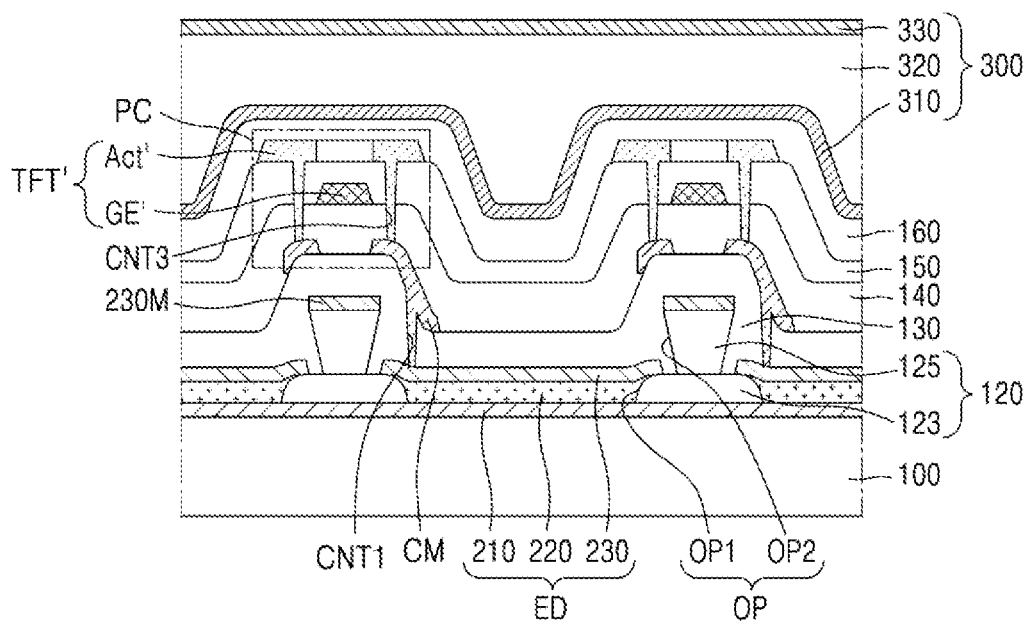
FIG. 5 is a schematic cross-sectional view of a display apparatus according to another embodiment.

FIG. 5 is a schematic cross-sectional view of a display apparatus according to another embodiment. In FIG. 5, the same reference numerals as those in FIG. 3 refer to the same members, and redundant descriptions thereof are omitted.

Referring to FIG. 5, the display apparatus according to an embodiment includes a substrate 100, a plurality of light-emitting elements ED on the substrate 100, a passivation layer 130 covering the light-emitting elements ED, and a plurality of pixel circuits PC on the passivation layer 130. That is, the light-emitting elements ED may be closer to the substrate 100 than the pixel circuits PC.

The light-emitting elements ED may be on the substrate 100. Each of the light-emitting elements ED may include a first electrode 210, an emission layer 220, and a second electrode 230.

The first electrode 210 may completely cover a display area of the substrate 100. The first electrode 210 may be integrally provided to correspond to the light-emitting elements ED. The first electrode 210 may be provided as a transparent electrode or a semitransparent electrode.

A pixel-defining layer 120 may be on the first electrode 210. The pixel-defining layer 120 has an opening OP exposing a central portion of the first electrode 210 of the light-emitting element ED.

In the present embodiment, the pixel-defining layer 120 may include a first pixel-defining layer 123 and a second pixel-defining layer 125 that are sequentially stacked. A first opening OP1 of the first pixel-defining layer 123 and a second opening OP2 of the second pixel-defining layer 125 overlap each other to form the opening OP of the pixel-defining layer 120. A side surface of the first opening OP1 may be positively tapered with respect to the upper surface of the substrate 100, and a side surface of the second opening OP2 may be reversely tapered with respect to the upper surface of the substrate 100. That is, a width of a body portion of the second pixel-defining layer 125 may increase as the distance from the upper surface of the substrate 100 increases. The body portion of the second pixel-defining layer 125 is a portion distinct from the second opening OP2 and refers to a portion having a certain volume.

The first pixel-defining layer 123 and the second pixel-defining layer 125 may include an organic insulating material such as polyimide, polyamide, acrylic resin, benzocyclobutene, HMDSO, and phenol resin, and may be formed by spin coating. Alternatively, the first pixel-defining layer 123 and the second pixel-defining layer 125 may include an inorganic insulating material. Alternatively, one of the first pixel-defining layer 123 and the second pixel-defining layer 125 may include an inorganic insulating material, and the other of the first pixel-defining layer 123 and the second pixel-defining layer 125 may include an organic insulating material.

In some embodiments, the second pixel-defining layer 125 may include a liquid-repellent material. The liquid-repellent material may be distributed over the entire second pixel-defining layer 125, or may be distributed on at least a portion of the surface of the second pixel-defining layer 125. When the emission layer 220 is formed by inkjet printing because the second pixel-defining layer 125 includes the liquid-repellent material, a liquid material forming the emission layer 220 is not affinitive to the side surface of the second pixel-defining layer 125, which may be advantageous in terms of the process.

In the pixel-defining layer 120, the emission layer 220 of the light-emitting element ED may be in the opening OP. The emission layer 220 may include an organic material including a fluorescent or phosphorescent material capable of emitting red light, green light, or red light. The above-described organic material may include a low molecular weight organic material or a high molecular weight organic material. In some embodiments, the emission layer 220 may include an inorganic material including quantum dots. A common layer may be above and/or below the emission layer 220.

The second electrode 230 is provided on the emission layer 220. The second electrode 230 may include a reflective electrode. The second electrode 230 may be arranged to correspond to each light-emitting element ED. That is, the second electrodes 230 may be apart from each other on the substrate 100.

Because the body portion of the second pixel-defining layer 125 has a reversed tapered structure, a conductive layer deposited so as to form the second electrode 230 is disconnected by the second pixel-defining layer 125, thereby forming the second electrodes 230. A disconnected conductive layer 230M may be on the upper surface of the second pixel-defining layer 125.

The passivation layer 130 may be formed on the entire surface of the substrate 100 while covering the light-emitting elements ED. The passivation layer 130 may include an inorganic material such as silicon oxide, silicon nitride, and/or silicon oxynitride. The passivation layer 130 may have a single-layer or multilayer structure including the inorganic materials. The passivation layer 130 may function as a protective layer that prevents infiltration of foreign material or moisture into the light-emitting elements ED.

Various conductive layers such as a connection electrode CM may be on the passivation layer 130. The connection electrode CM may be connected to the second electrode 230 of the light-emitting element ED through a first contact hole CNT1 passing through the passivation layer 130. Also, the connection electrode CM may be electrically connected to the pixel circuit PC on the connection electrode CM. For example, the connection electrode CM may be connected to the TFT included in the pixel circuit PC. In this case, the connection electrode CM may act as a source electrode or a drain electrode of the TFT. As such, the pixel circuit PC and the light-emitting element ED may be electrically connected to each other by the connection electrode CM.

A first insulating layer 140 may be on the passivation layer 130 to cover the connection electrode CM, and the pixel circuit PC may be on the first insulating layer 140. The pixel circuit PC includes at least one TFT TFT'.

The TFT TFT' may include a semiconductor layer Act' and a gate electrode GE'. The gate electrode GE' may be on the first insulating layer 140, may include molybdenum (Mo), aluminum (Al), copper (Cu), titanium (T1), and the like, and may include a single layer or multiple layers. The gate electrode GE' may be arranged to overlap the semiconductor layer Act' thereon. A second insulating layer 150 may be between the gate electrode GE' and the semiconductor layer Act'.

The semiconductor layer Act' may be on the second insulating layer 150 and may include an oxide semiconductor. For example, the semiconductor layer Act' may include an oxide of at least one selected from indium ('In), gallium (Ga), stannum (Sn), zirconium (Zr), vanadium (V), hafnium (Hf), cadmium (Cd), germanium (Ge), chromium (Cr), titanium (Ti), and zinc (Zn). In another embodiment, the semiconductor layer Act' may include polysilicon or amorphous silicon. The semiconductor layer Act' may include a channel region, and a source region and a drain region having high conductivity on both sides of the channel region. The source region or the drain region of the semiconductor layer Act' may be connected to the connection electrode CM through a third contact hole CNT3 passing through the second insulating layer 150 and the first insulating layer 140. A third insulating layer 160 may be arranged to the cover the semiconductor layer Act'. The third insulating layer 160 may include an inorganic material.

A thin-film encapsulation layer 300 may be on the third insulating layer 160. The thin-film encapsulation layer 300 may include at least one inorganic encapsulation layer and at least one organic encapsulation layer. In an embodiment, the thin-film encapsulation layer 300 may include first and second inorganic encapsulation layers 310 and 330 and an organic encapsulation layer 320 therebetween.

As illustrated in FIG. 5, the TFT TFT' included in the pixel circuit PC may be a bottom gate type transistor in which a gate electrode is below a semiconductor layer. In another embodiment, the TFT TFT' may be variously modified. For example, the TFT TFT' may be a top gate type transistor in which a gate electrode is above a semiconductor layer.

In the display apparatus according to an embodiment, because the light-emitting element ED is closer to the substrate 100 than the pixel circuit PC, the surface on which the light-emitting element ED is flat. Therefore, an organic planarization layer may not be provided. Accordingly, outgassing due to the organic material may not occur. Also, in the display apparatus according to an embodiment, light emitted from the light-emitting element ED may travel to the lower surface of the substrate 100, and thus, an aperture ratio of the emission area may be sufficiently secured.

FIGS. 6A to 6E are schematic cross-sectional views sequentially illustrating a method of manufacturing the display apparatus of FIG. 5, according to an embodiment.

Figure 6A:
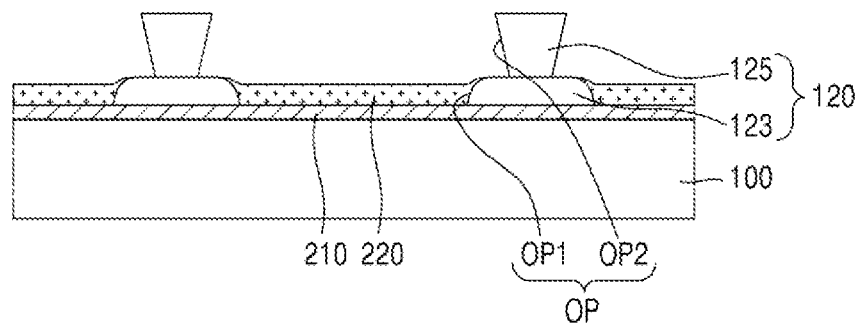
FIGS. 6A, 6B, 6C, 6D, and 6E are schematic cross-sectional views sequentially illustrating a method of manufacturing the display apparatus of FIG. 5, according to an embodiment.

Referring to FIG. 6A, a first electrode 210 is formed on a substrate 100. The first electrode 210 may include a conductive layer of a transparent electrode or a semitransparent electrode, and may be formed by various deposition processes.

A pixel-defining layer 120 is formed on the first electrode 210. The pixel-defining layer 120 may include a first pixel-defining layer 123, and a second pixel-defining layer 125 on the first pixel-defining layer 123. A first opening OP1 exposing the upper surface of the first electrode 210 may be formed in the first pixel-defining layer 123, and a second opening OP2 overlapping the first opening OP1 is formed in the second pixel-defining layer 125.

The second pixel-defining layer 125 may include a liquid-repellent material. The second pixel-defining layer 125 may be formed by applying a photosensitive resin composition including a liquid-repellent material and then performing a light exposure process and a curing process thereon. In this case, the process may be performed under a condition that a body portion of the second pixel-defining layer 125 has a reversed tapered structure. Therefore, the side surface of the second opening OP2 may be reversely tapered with respect to the upper surface of the substrate 100.

An emission layer 220 is formed in the opening OP of the pixel-defining layer 120. The emission layer 220 may be formed by inkjet printing. Because the second pixel-defining layer 125 includes a liquid-repellent material, the emission layer 220 may be stably arranged in the opening OP without overflowing the opening OP of the pixel-defining layer 120.

Figure 6B:
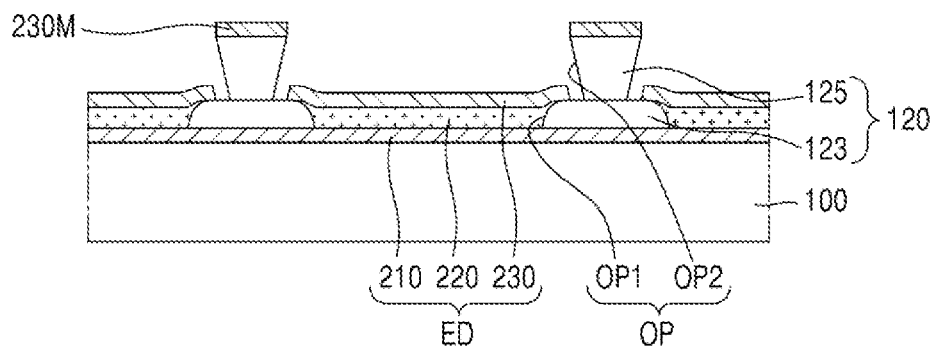

Referring to FIG. 6B, a conductive layer forming the second electrode 230 is deposited on the entire surface of the substrate 100 on which the first electrode 210, the pixel-defining layer 120, and the emission layer 220 are formed. The conductive layer may be formed by various deposition methods.

Because the body portion of the second pixel-defining layer 125 has a reversed tapered structure, the conductive layer may be disconnected by the second pixel-defining layer 125. Therefore, a plurality of second electrodes 230 may be formed on each light-emitting element ED, and the second electrodes 230 may be apart from each other. A disconnected conductive layer 220M may be on the second pixel-defining layer 125.

As such, the first electrode 210, the emission layer 220, and the second electrode 230 may be stacked to form the light-emitting element ED.

Figure 6C:
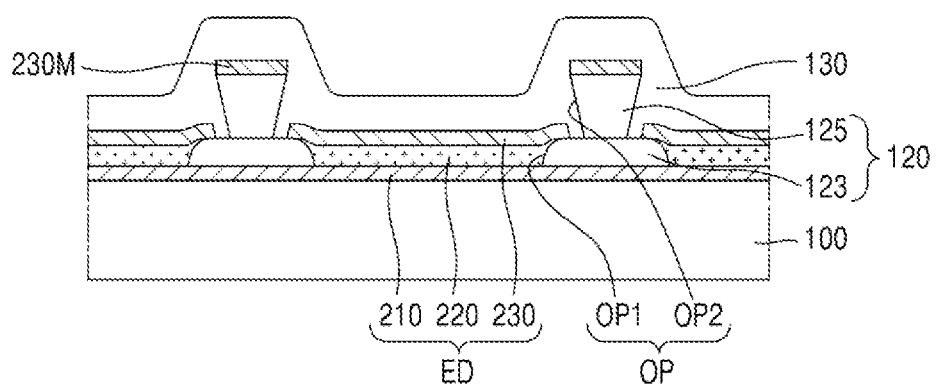

Referring to FIG. 6C, a passivation layer 130 covering the light-emitting elements ED is formed. The passivation layer 130 may include a single layer or multiple layers including an inorganic material such as silicon oxide, silicon nitride, and/or silicon oxynitride. The passivation layer 130 may be formed by a CVD process.

Figure 6D:
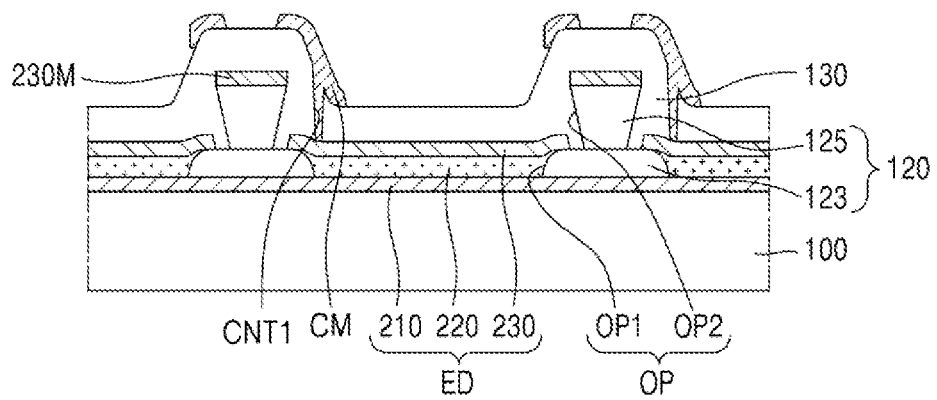

Referring to FIG. 6D, a first contact hole CNT1 is formed in the passivation layer 130, and a connection electrode CM is formed. The connection electrode CM may be connected to the second electrode 230 through the first contact hole CNT1.

Figure 6E:
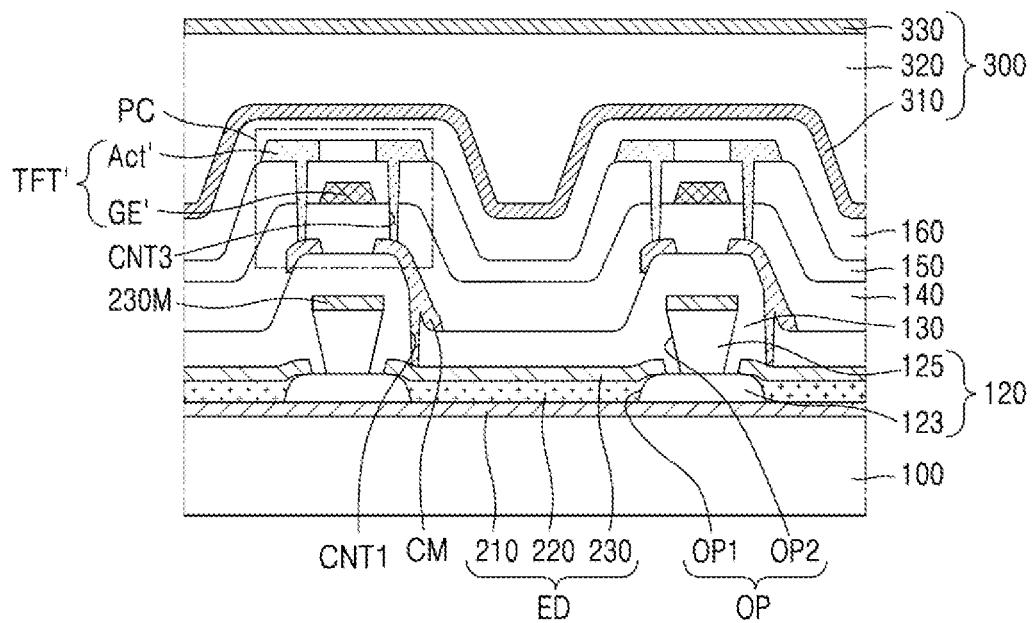

Referring to FIG. 6E, a pixel circuit PC and a thin-film encapsulation layer 300 are formed on the connection electrode CM, thereby completing a display apparatus.

As described above, according to one or more embodiments, because the light-emitting element is closer to the substrate than the pixel circuit that drives the light-emitting element, the flatness of the surface on which the light-emitting element is arranged may be increased, and thus, the quality may be improved. The scope of the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
a substrate;
a plurality of light-emitting elements on the substrate;
a passivation layer covering the plurality of light-emitting elements;
a connection electrode on the passivation layer;
an inorganic insulating layer covering the passivation layer and the connection electrode; and
a plurality of pixel circuits on the passivation layer and connected to the plurality of light-emitting elements, respectively,
wherein the plurality of light-emitting elements each comprise:
a first electrode integrally provided with the plurality of light-emitting elements on the substrate;
an emission layer in an opening of a pixel-defining layer on the first electrode; and
a second electrode on the emission layer, and wherein
the passivation layer comprises an inorganic material,
the plurality of pixel circuits are on the inorganic insulating layer, and
the connection electrode extends through the passivation layer and connects one of the plurality of pixel circuits to one of the plurality of light-emitting elements.

2. The display apparatus of claim 1, wherein the first electrode comprises:
a transparent or semitransparent electrode, and the second electrode comprises a reflective electrode.

3. The display apparatus of claim 1, wherein the emission layer comprises:
an inorganic material including quantum dots.

4. The display apparatus of claim 1, wherein the plurality of pixel circuits comprise: a thin-film transistor, and the thin-film transistor comprises an oxide semiconductor.

5. The display apparatus of claim 4, wherein the thin-film transistor is connected to one of the plurality of light-emitting elements through the connection electrode.

6. The display apparatus of claim 1, wherein the pixel-defining layer comprises:
a first pixel-defining layer, and a second pixel-defining layer on the first pixel-defining layer, and a body portion of the second pixel-defining layer has a reversed tapered structure.

7. The display apparatus of claim 6, wherein the second pixel-defining layer comprises:
a liquid-repellent material.

8. The display apparatus of claim 1, further comprising:
a thin-film encapsulation layer on the plurality of pixel circuits,
wherein the thin-film encapsulation layer comprises at least one inorganic encapsulation layer and at least one organic encapsulation layer.

9. The display apparatus of claim 8, wherein the thin-film encapsulation layer comprises:
a first inorganic encapsulation layer, a second inorganic encapsulation layer, and an organic encapsulation layer between the first inorganic encapsulation layer and the second inorganic encapsulation layer.

10. A method of manufacturing a display apparatus, the method comprising:
forming a first electrode on one surface of a substrate;
forming a pixel-defining layer on the first electrode, the pixel-defining layer having a plurality of openings;
forming an emission layer in each of the plurality of openings;
forming a second electrode corresponding to the plurality of openings;
forming a passivation layer on the second electrode, wherein the passivation layer comprises an inorganic material;
forming a pixel circuit on the passivation layer, the pixel circuit comprising a thin-film transistor;
forming a contact hole in the passivation layer to expose a part of the second electrode;
forming a connection electrode on the passivation layer and in the contact hole to connect the connection electrode to the second electrode;
forming an inorganic insulating layer covering the passivation layer and the connection electrode;
forming an opening in the inorganic insulating layer over the connection electrode;
connecting a source region or a drain region of the thin-film transistor to the connection electrode through the opening in the inorganic insulating layer, wherein the passivation layer is formed by a chemical vapor deposition process.

11. The method of claim 10, wherein the first electrode is formed as a transparent or semitransparent electrode, and the second electrode is formed as a reflective electrode.

12. The method of claim 10, wherein the emission layer is formed by inkjet printing.

13. The method of claim 10, wherein the second electrode is deposited by using a fine metal mask (FMM).

14. The method of claim 10, wherein the thin-film transistor includes an oxide semiconductor.

15. The method of claim 14, wherein the thin-film transistor is connected to the second electrode through the connection electrode.

16. The method of claim 10, wherein the pixel-defining layer is formed to have a first pixel-defining layer, and a second pixel-defining layer on the first pixel-defining layer, and a body portion of the second pixel-defining layer has a reversed tapered structure.

17. The method of claim 16, wherein the second pixel-defining layer is formed to have a liquid-repellent material.

18. The method of claim 16, wherein an end of the second electrode is disconnected by the second pixel-defining layer.

* * * * *